(12) United States Patent
Treibergs

(10) Patent No.: US 7,256,593 B2
(45) Date of Patent: Aug. 14, 2007

(54) ELECTRICAL CONTACT PROBE WITH COMPLIANT INTERNAL INTERCONNECT

(75) Inventor: Valts Treibergs, White Bear Township, MN (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 11/450,231

(22) Filed: Jun. 8, 2006

(65) Prior Publication Data

US 2006/0279301 A1    Dec. 14, 2006

Related U.S. Application Data

(60) Provisional application No. 60/689,755, filed on Jun. 10, 2005.

(51) Int. Cl.
*G01R 31/02* (2006.01)

(52) U.S. Cl. .................................................. 324/754

(58) Field of Classification Search ............... 324/754, 324/761, 757; 439/66; 257/48
See application file for complete search history.

(56) References Cited

U.S. PATENT DOCUMENTS

| 6,299,459 | B1 * | 10/2001 | Botka et al. | 439/66 |
| 6,396,293 | B1 * | 5/2002 | Vinther et al. | 324/761 |
| 6,398,592 | B1 * | 6/2002 | Mori et al. | 439/700 |
| 6,462,567 | B1 * | 10/2002 | Vinther et al. | 324/754 |
| 6,506,082 | B1 * | 1/2003 | Meek et al. | 439/700 |
| 6,769,919 | B2 * | 8/2004 | Kosmala | 439/66 |
| 7,025,602 | B1 * | 4/2006 | Hwang | 439/66 |
| 2002/0113609 | A1 * | 8/2002 | Noda | 324/754 |

* cited by examiner

*Primary Examiner*—Ha Tran Nguyen
*Assistant Examiner*—Joshua Benitez
(74) *Attorney, Agent, or Firm*—Christie, Parker & Hale, LLP

(57) ABSTRACT

A compliant electrical interconnect having a first component and a second component interlockingly engaged with the first component. Each component has two cantilever arms lockingly engaged and continuously biased against each other. Contact springs are captivated by the cantilever arms providing a contact force for the first and second components.

17 Claims, 8 Drawing Sheets

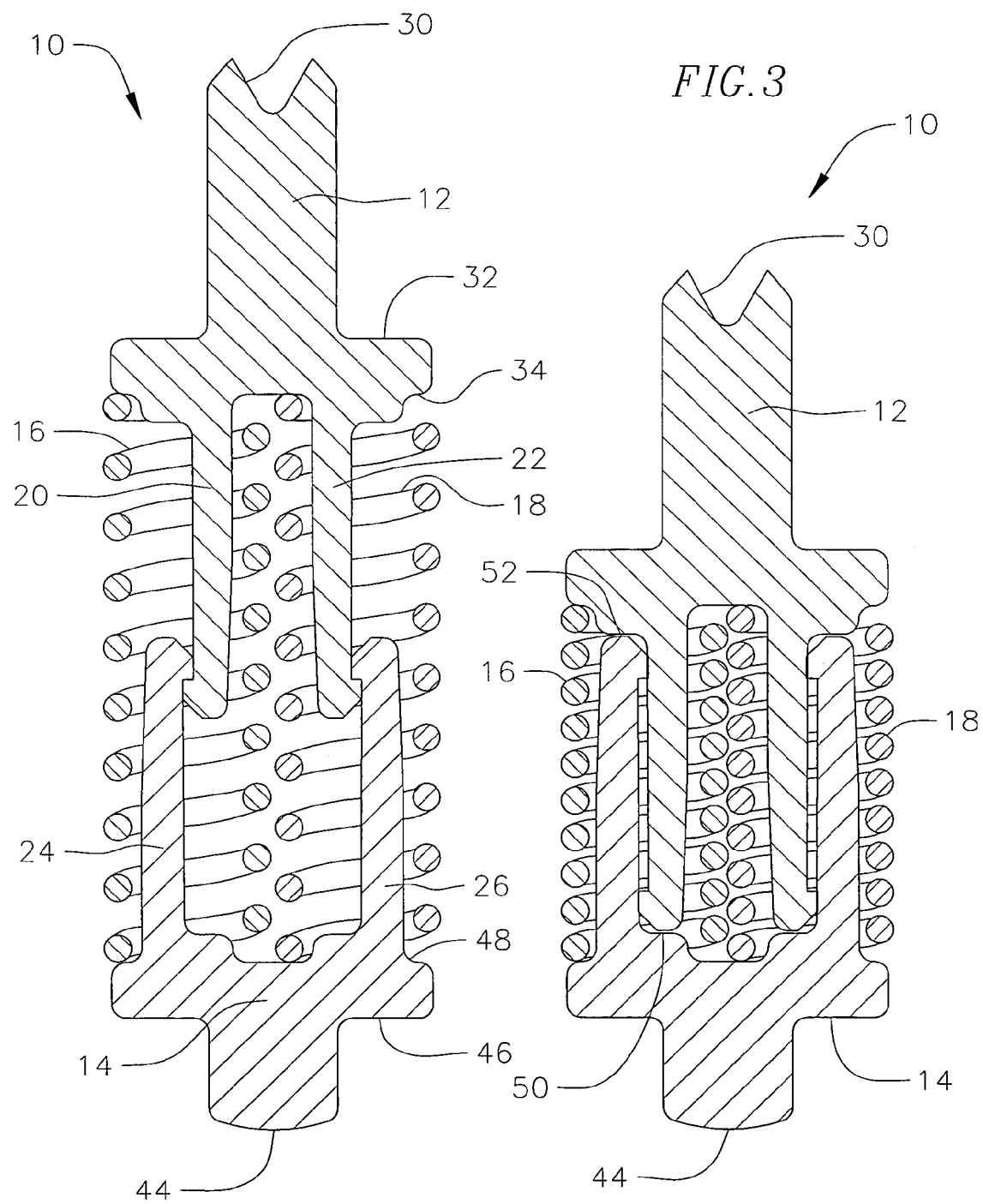

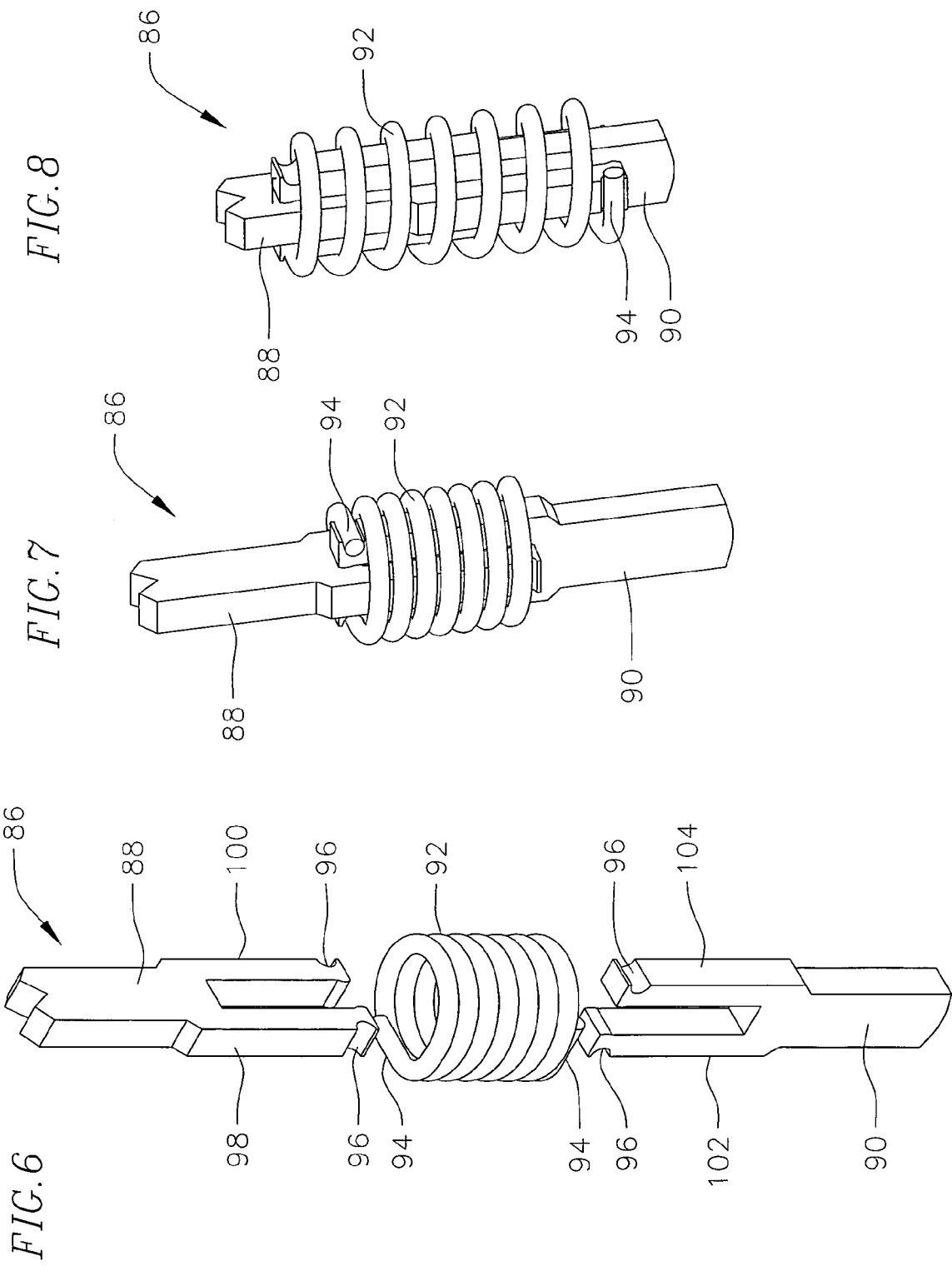

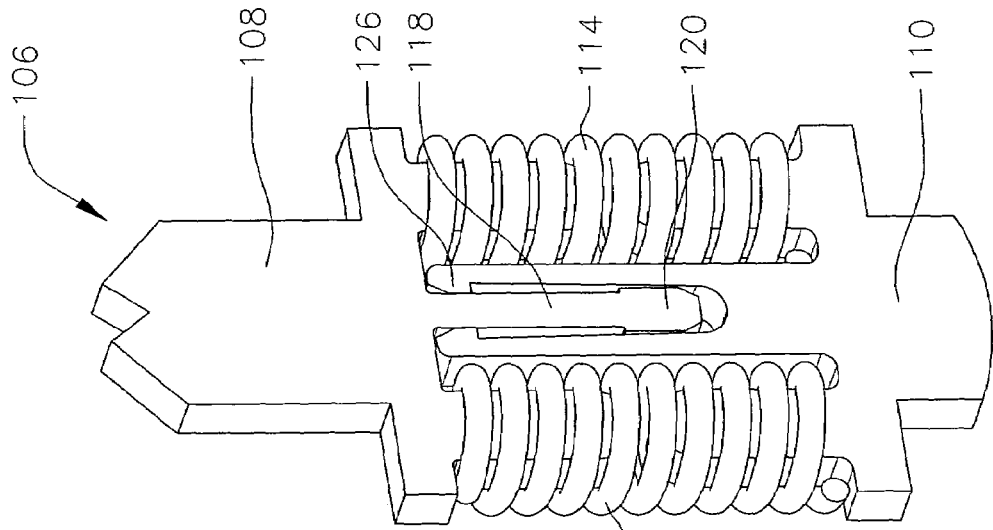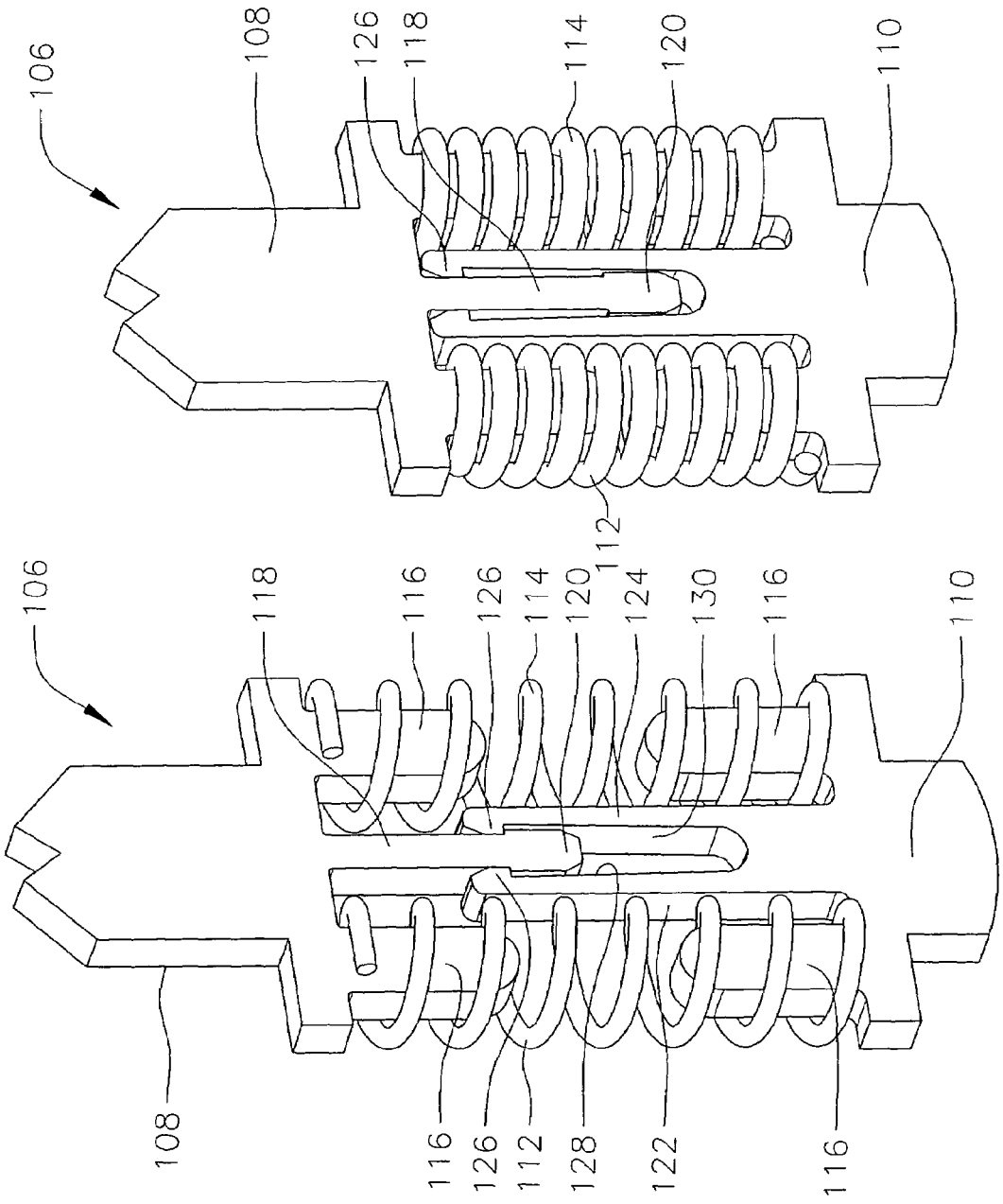

ELECTRICAL CONTACT PROBE WITH COMPLIANT INTERNAL INTERCONNECT

CROSS-REFERENCE TO RELATED APPLICATION(S)

This application claims the benefit of U.S. Provisional Patent Application No. 60/689,755, filed Jun. 10, 2005, the disclosure of which is hereby incorporated by reference herein.

FIELD OF THE INVENTION

The present invention relates to electrical contact probes for forming electrical interconnects and, more particularly, to a compliant electrical interconnect between a printed circuit board and the external leads of an integrated circuit package or other electrical circuit, such as an electronic module, during functional testing of the devices.

BACKGROUND OF THE INVENTION

Conventional spring-loaded contact probes generally include a moveable plunger, a barrel having an open end for containing an enlarged diameter section or bearing of the plunger, and a spring for biasing the travel of the plunger in the barrel. The plunger bearing slideably engages the inner surface of the barrel. The enlarged bearing section is retained in the barrel by a crimp near the barrel's open end.

The plunger is commonly biased outwardly a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head, or tip, for contacting electrical devices under test. The barrel may also include a tip opposite the barrel's open end.

The barrel, plunger and tip form an electrical interconnect between the electrical device under test and test equipment and, as such, are manufactured from an electrically conductive material. Typically, the probes are fitted in cavities formed through the thickness of a test plate or socket. Generally, a contact side of the electrical device to be tested, such as an integrated circuit, is brought in to pressure contact with the tips of the plungers protruding through one side of the test plate or test socket for maintaining spring pressure against the electrical device. A contact plate connected to the test equipment is brought to contact with the tips of the plungers protruding through the other side of the test plate or test socket. The test equipment transmits test signals to the contact plate from where they are transmitted through the test probe interconnects to the device being tested. After the electrical device has been tested, the pressure exerted by the spring probes is released and the device is removed from contact with the tip of each probe. In conventional systems, the pressure is released by moving the electrical device and probes away from one another, thereby allowing the plungers to be displaced outwardly away from the barrel under the force of the spring, until the enlarged diameter bearing the plunger engages the crimp of the barrel.

The process of making a conventional spring probe involves separately producing the compression spring, the barrel and the plunger. The compression spring is wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process. The assembly process for these probes is a multiple step process. Considering that probes are produced by the thousands, a reduction in the equipment and the steps required to produce the probes will result in substantial savings.

An important aspect of testing integrated circuit boards is that they are tested under high frequencies. As such, impedance matching is required between the test equipment and integrated circuit so as to avoid attenuation of the high frequency signals. Due to the numerous probes that are used in relatively small area in the socket, the spacing between probes is minimal making impedance matching infeasible. In such situations, in order to avoid attenuation of the high frequency signals, the length of the electrical interconnects formed by the probes must be kept to a minimum. With current probes, when the interconnect length is minimized, so is the spring length and thus spring volume.

A spring's operating life, as well as the force applied by a spring are proportional to the spring volume. Consequently, the spring volume requirements for a given spring operating life and required spring force are in contrast with the short spring length requirements for avoiding the attenuation of the high frequency signals. Since the diameter of the spring is limited by the diameter of the barrel which is limited by the diameter of the cavities in the test sockets, the only way to increase the spring volume for increasing the spring operating life, as well as the spring force, is to increase the overall barrel length. Doing so, however, results in a probe having an electrical interconnect of increased length resulting in the undesirable attenuation of the high frequency signals.

An alternative type of conventional probe consists of two contact tips separated by a spring. Each contact tip is attached to a spring end. This type of probe relies on the walls of the test plate or socket cavity into which it is inserted for lateral support. The electrical path provided by this type of probe spirals down the spring wire between the two contact tips. Consequently, this probe has a relatively long electrical interconnect length which may result in attenuation of the high frequency signals when testing integrated circuits.

Thus, it is desirable to reduce the electrical interconnect length of a probe without reducing the spring volume. In addition, it is desirable to increase the spring volume without decreasing the spring compliance or increasing the electrical interconnect length. Moreover, a probe is desirable that can be easily manufactured and assembled.

SUMMARY OF THE INVENTION

The present invention is an improved electrical contact probe with compliant internal interconnect which has been designed to address the drawbacks of prior probe designs. The purpose of the invention is to provide a compliant electrical interconnect between a printed circuit board (PCB) and the external leads of an integrated circuit (IC) package or other electrical circuit, such as an electronic module, during functional testing of the devices. The probe of the present invention consists of two moving fabricated electrically conductive components with one or more electrically conductive compliant helical springs or compliant nonconductive structures in between the components. The compliance of the interconnect is maximized in order to accommodate mechanical tolerances in the interconnect application. In additional to maximizing the mechanical compliance, the helical spring(s) or compliant non-conductive structures of the contact provide adequate normal force to the part under test and PCB in order to provide electrical contact that maintains stable contact resistance. The overall length of the contact is minimized, in order to maximize high frequency response of the overall connection system thereby minimizing electrical inductance and optimizing the AC electrical transmission path.

Many compliant interconnect designs that utilize springs as compliant members also use the same spring to provide a biasing force between the moving parts of the interconnect. Some designs use an angle bearing surface to provide a slight offset force between the parts during the compliant stroke of the assembly. This bias action between the components improves electrical connectivity between them, however often also influences the force that the assembly can provide to the IC and PCB in such a way that could degrade the interconnect. The present invention provides a bias between the upper and lower component completely independent of this spring(s) or compliant non-conductive structures that provide the contact force for the device under test. The probe of the present invention consists of four flexible cantilever arms that interconnect with each other. During the deflection of the components during the stroke of the probe, the interlocking cantilever arms are always in intimate contact with the mating arm, as the arms are designed specifically with a slight amount of interference with each other. This interference causes the arms to slightly deflect perpendicularly to the force provided by the springs. The design is such that even if the components are slightly rotated and angled with respect to each other, this perpendicular cantilever normal force always maintains contact at least on one point on each arm. By guaranteeing that intimate contact is always maintained, the overall electrical integrity of the probe is maximized by maintaining stable contact resistance from one end of the assembly to the other.

At the end of each of the four cantilever arms is a small interlocking tab. During the assembly of the probe, the tab rubs against the tabs of the mating component, thus deflecting the cantilever arms and allowing the components to snap together, captivating the helical coil springs or compliant non-conductive structures between the components. Once captivated after the probe assembly process, the springs maintain a slight pressure exerting a force against the tabs on the cantilever arms in an axial direction. This force maintains a pre-load within the assembly that maintains a consistent assembled overall length. The interlocked arms of the probe assembly are permanently held within the inner diameter of the helical springs or compliant non-conductive structures, and the geometry is such that lateral motion of the assembled parts will not dislodge the locking tabs, thus the probe is self-contained and requires no external housing to hold it together.

BRIEF DESCRIPTION OF THE DRAWINGS

FIG. 2 is a cross-sectional view of the probe of FIG. 1 in an extended position;

FIG. 3 is a cross-sectional view of the probe of FIG. 1 in a compressed position;

FIG. 6 is an exploded perspective view of second alternative embodiment electrical contact probe;

FIG. 7 is a perspective view of the probe of FIG. 6 in an extended position;

FIG. 8 is a perspective view of the probe of FIG. 6 in a compressed position;

FIG. 9 is a perspective view of a third alternative embodiment electrical contact probe in an extended position;

FIG. 10 is a perspective view of the probe of FIG. 9 in a retracted position;

DETAILED DESCRIPTION

Figure 1:
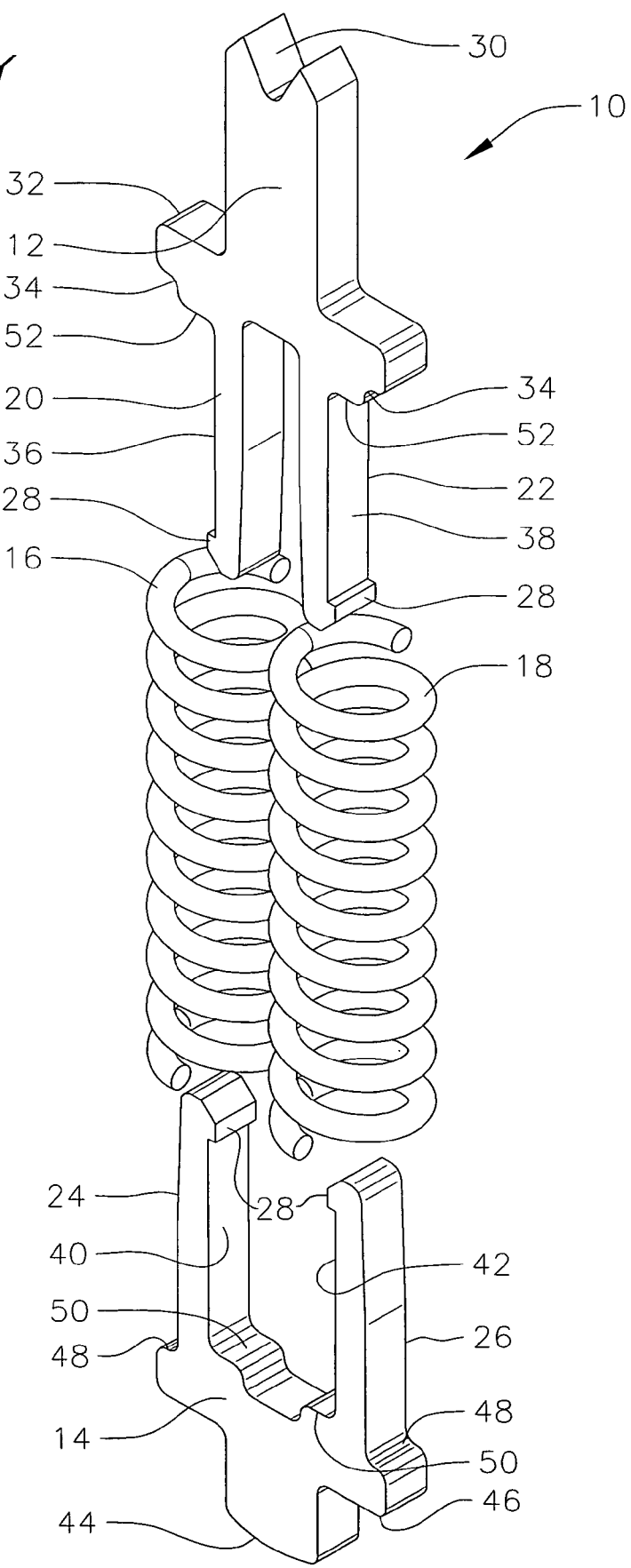
FIG. 1 is an exploded perspective view of an electrical contact probe of the present invention.

FIGS. 1-3 illustrate an electrical contact probe 10 with compliant internal interconnect of the present invention. The probe 10 consists of two moving fabricated electrically conductive components, namely upper component or plunger 12 and lower component or barrel 14 with one or more electrically conductive compliant helical springs 16 and 18 in between upper component 12 and lower component 14. The compliance of the interconnect is maximized in order to accommodate mechanical tolerance of the interconnect application. In addition to maximizing the mechanical compliance, the helical springs or other compliant non-conductive structures of the spring probe provide adequate normal force to the unit under test and the printed circuit board between which the spring probe is placed in order to provide electrical contact that maintains stable contact resistance. The overall length of the contact probe is minimized, in order to maximize high frequency response of the overall connection system, by minimizing electrical inductance and optimizing the AC electrical transmission path.

The contact probe 10 provides a bias between the upper component 12 and the lower component 14 completely independently of the springs or other compliant non-conductive structures that provides the contact force for the unit under test. The contact probe accomplishes this objective by including four flexible cantilever arms, namely arms 20 and 22 on upper component 12 and arms 24 and 26 on lower component 14. Cantilever arms 20 and 22 interlock with cantilever arms 24 and 26. During deflection of the upper component with respect to the lower component during the stroke of the contact probe, the interlocking cantilever arms are always in intimate contact with its mating cantilever arm, as the arms are designed specifically with a slight amount of interference with each other. This interference causes the arms to slightly deflect perpendicularly to the force provided by the springs. This design maintains contact even if the upper component and the lower component are slightly rotated and angled with respect to each other because the perpendicular cantilever normal force always maintains contact on at least one point on each arm. By guaranteeing this intimate contact being maintained, the overall electrical integrity of the probe is maximized by maintaining stable contact resistance from one end of the assembly to the other.

Positioned on the end of each cantilever arm is a small interlocking tab 28. During the assembly of the probe, the tabs rub against the tabs of mating component, thus deflecting the cantilever arms and allowing the components to snap together captivating the helical coil springs or other compliant non-conductive structures between the components. Once captivated after the contact probe assembly process, the springs maintain a slight pressure exerting a force against the tabs on the cantilever arms in an axial direction. This force maintains a preload within the assembly that maintains a consistent assembled overall length. The interlocked cantilevered arms of the assembly are permanently held within the inner diameter of the helical springs or compliant non-conductive structures, and the geometry is such that lateral motion of the assembled parts will not dislodge the locking tabs, thus the contact probe is self-contained and requires no external housing to hold it together.

The upper component 12 has a probe tip 30 with a v-shaped indentation for contact with the integrated circuit or unit under test. The probe tip 30 extends upwardly from shoulder 32 and cantilever arms 20 and 22 extend downwardly from shoulder 32. Shoulder 32 includes a spring centering indentation 34 for receipt of the end coil of springs 16 and 18. As stated previously, cantilever arms 20 and 22 have a tapered surface 36 and 38, respectively, which engage interlocking tabs 28 of lower component 14. Lower component 14 includes tapered surfaces 40 and 42 which engage interlocking tabs 28 of upper component 12. Similarly, lower component 14 has a probe tip 44 for engaging a printed circuit board. Probe tip 44 extends down from shoulder 46 and cantilever arms 24 and 26 extend upwardly from shoulder 46. Shoulder 46 also includes a spring centering indentation 48 for receipt of the bottom coil of springs 16 and 18. Shoulder 46 also has stop surfaces 50 for the ends of cantilever arms 20 and 22. Similarly, shoulder 32 of upper component 12 has stop surfaces 52 for the ends of cantilever arms 24 and 26, as best seen in FIG. 3.

Figure 4:
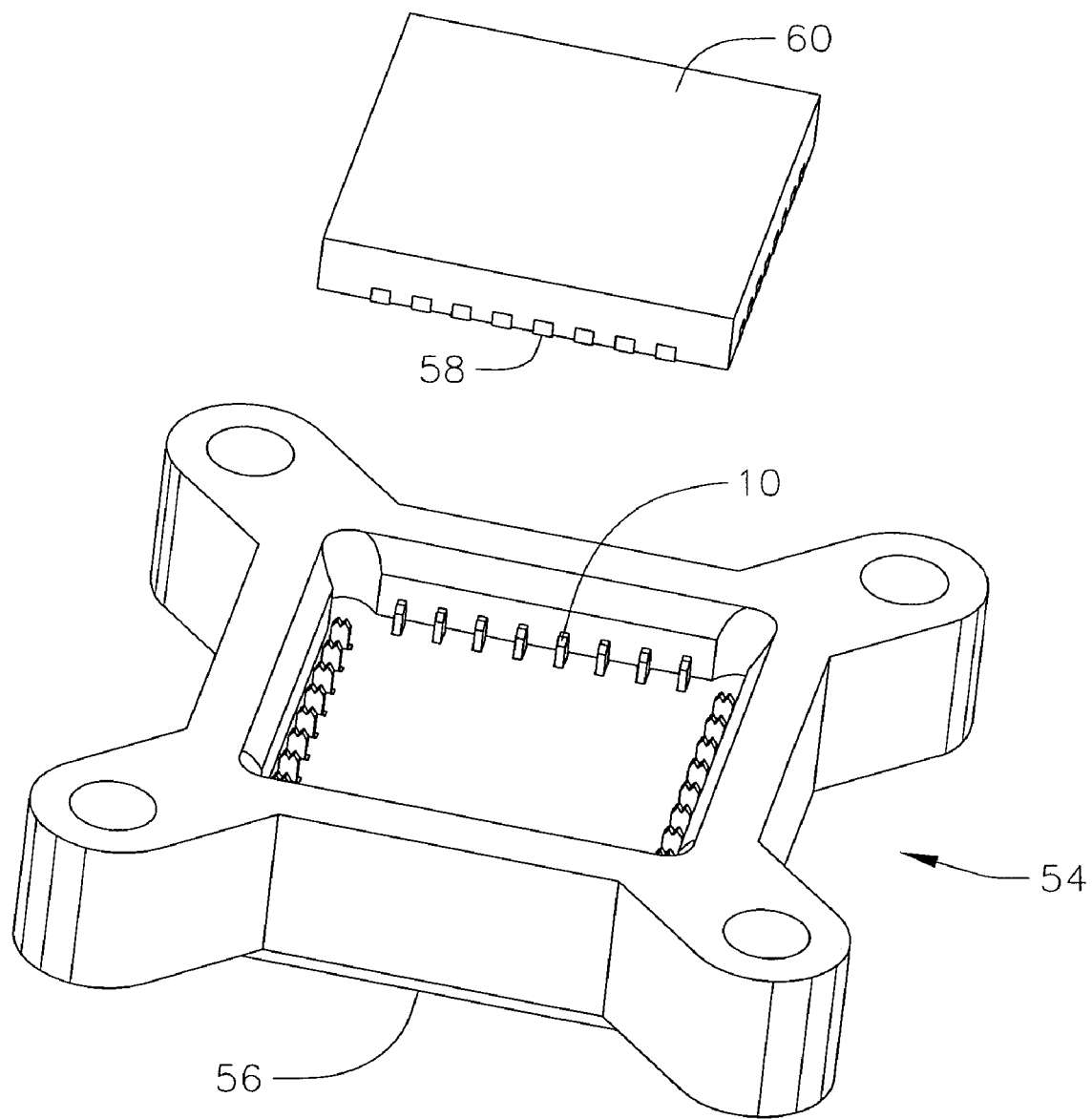
FIG. 4 is a perspective view of the electrical contact probe of the present invention as mounted into a semi-conductor test contactor.

As shown in FIG. 4, a plurality of electrical contact probes 10 are positioned in a semi-conductor test contactor 54 to provide a compliant electrical interconnect between a printed circuit board 56 and the external leads 58 of an integrated circuit package 60 or other electrical circuit during functional testing of the integrated circuit package. The interlocking upper component 12 and lower component 14 are constructed from a two-dimensional profile with a given thickness depending upon the particular application and unit under test being tested. The interlocking cantilever arms slightly flex during the complete actuation stroke of the probe thus providing intimate contact between the upper and lower components and guaranteeing that consistent electrical resistance is maintained. The slight taper on the cantilever arms ensures that the intimate contact is increased as the probe is compressed during normal operation. The contact probe can accommodate one or more springs or other compliant non-conductive structures in parallel so that the desired contact pressure can be achieved for optimum electrical stability while minimizing overall interconnect length.

Figure 5:
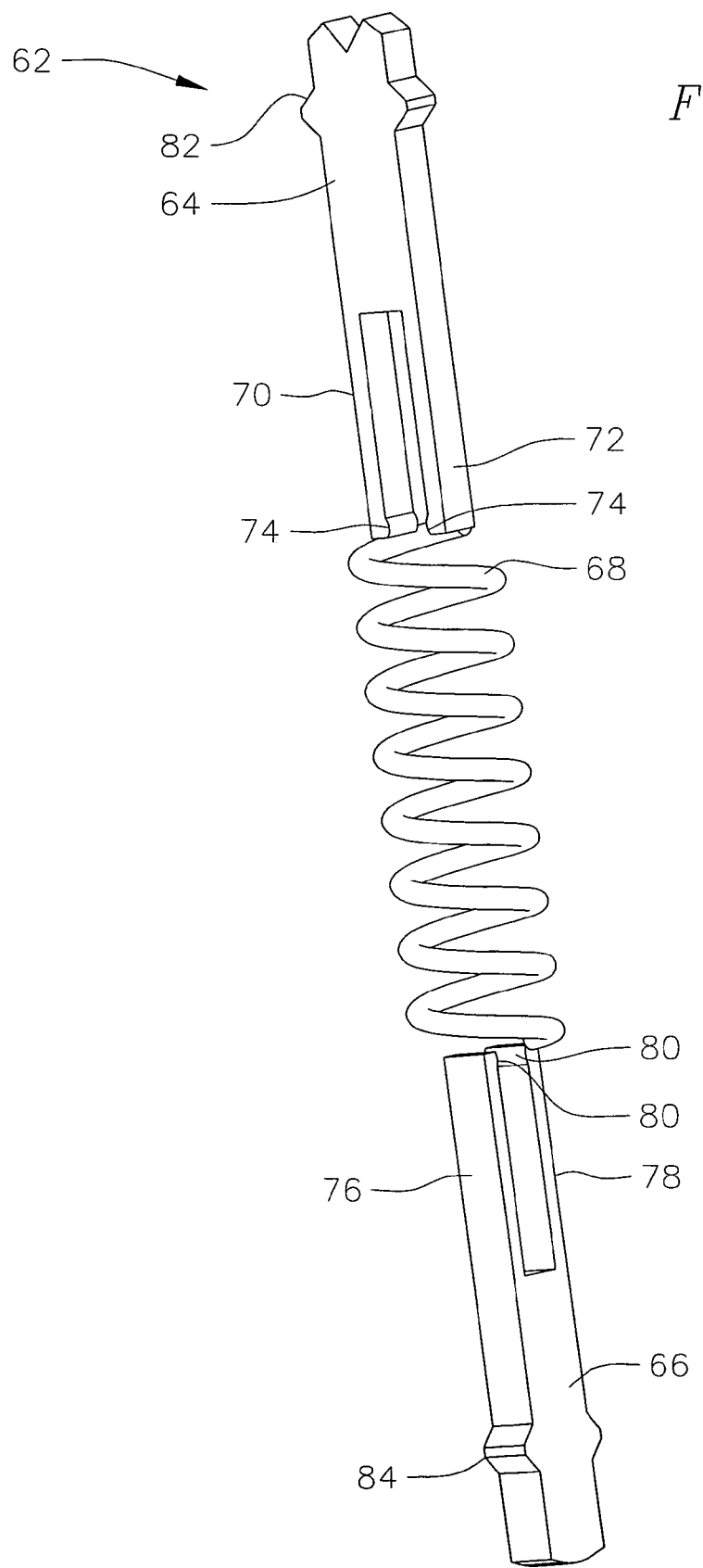
FIG. 5 is an exploded perspective view of a first alternative embodiment electrical contact probe.

FIG. 5 illustrates a first alternative embodiment contact probe 62 of the present invention. Contact probe 62 includes an upper component 64 and a lower component 66 and a single compliant spring 68. Upper component 64 has two cantilever arms 70 and 72 each having an interlocking tab 74 positioned at the end of the arm. Similarly, lower component 66 has two cantilever arms 76 and 78 each having an interlocking tab 80 positioned at the end of cantilever arm. In this embodiment, the upper component 64 and lower component 66 are arranged perpendicularly to one another such that cantilever arms 70 and 72 pinch lower component 66 and cantilever 76 and 78 pinch upper component 64. Upper component 64 includes a stop 82 and lower component 66 includes a stop 84 for retaining spring 68.

FIGS. 6-8 illustrate another alternative embodiment contact probe 86. Contact probe 86 includes an upper component 88 and lower component 90 and an extension helical coil spring 92 rather than a compression spring. When contact probe 86 is deflected the spring 92 is stretched. The compression spring is secured to the upper and lower components by aligning the formed ends 94 of the extension spring into notches 96 formed in the cantilever arms 98, 100, 102 and 104 of upper component 88 and lower component 90, respectively.

FIGS. 9 and 10 illustrate yet another alternative embodiment contact probe 106 of the present invention. Contact probe 106 has an upper component 108 and a lower component 110 and dual compression springs 112 and 114. Both upper component 108 and lower component 110 have flanges 116 which extend into the inner diameter of the compression springs 112 and 114 to center the springs on the contact probe. The upper component 108 and lower component 110 are connected by an alternative latching mechanism that is not contained within the inner diameter of the springs, but is in a central region of the probe. Upper component 108 has a single cantilever arm 118 having an enlarged head portion 120 which is captivated between two cantilever arms 122 and 124 of lower component 110 by interlocking tabs 126 located on the end of each cantilever arm. Cantilever arms 122 and 124 have an angled inner surface 128 and 130, respectively, to provide a slight offset force between the parts during the compliance stroke of the probe.

Figure 11:
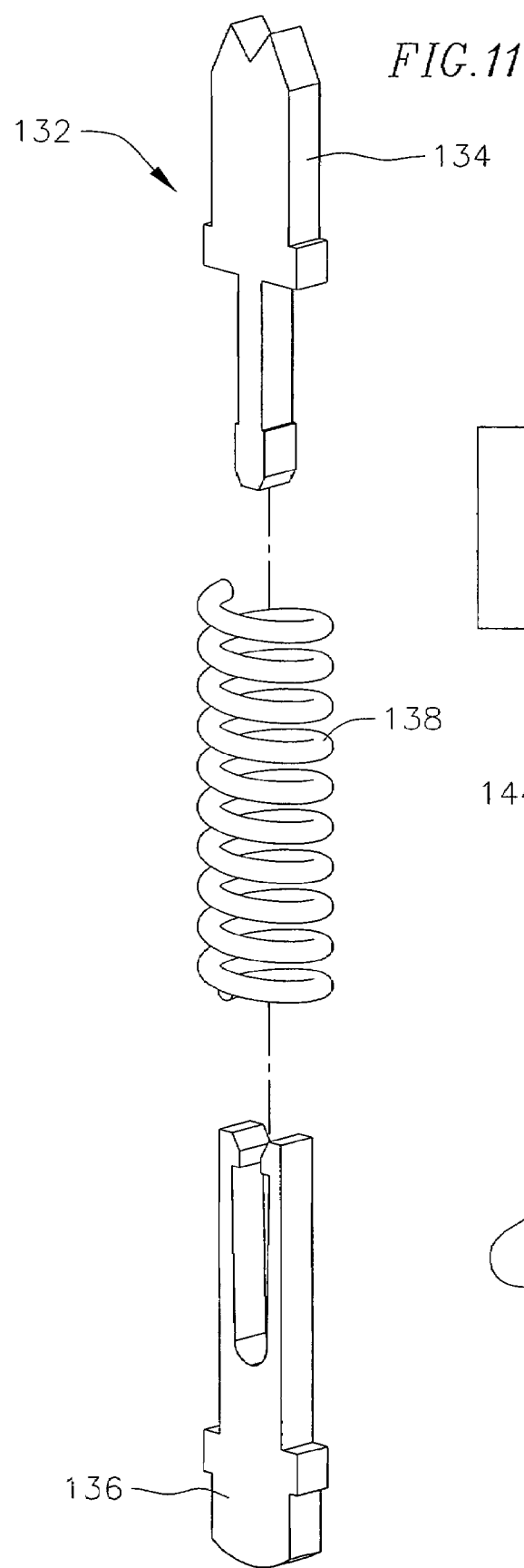
FIG. 11 is an exploded perspective view of a fourth alternative embodiment electrical contact probe.

FIG. 11 illustrates yet another alternative contact probe design 132 having a latching component for upper component 134 and lower component 136 which is the same as the latching mechanism for contact probe 106. However probe 132 is a single spring 138 design and the latching component is contained within the inner diameter of spring 138.

Figure 12:
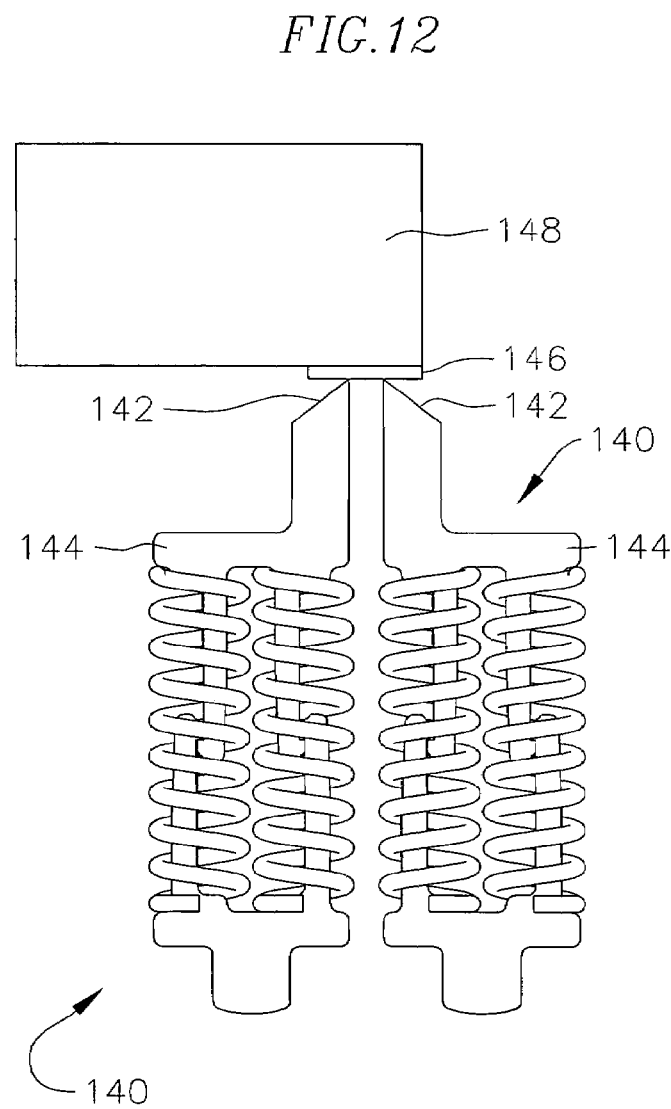
FIG. 12 is a front view of a fifth alternative embodiment electrical contact probe.

FIG. 12 illustrates another alternative embodiment contact probe 140 of the present invention. Contact probe 140 is identical in construction to contact probe 10 with the exception of the probe tip 142 for upper component 144. In this embodiment, probe tip 142 is offset and has an angled surface leading to a contact point and provides a manufacturable solution to be able to contact a very small pad 146 of an integrated circuit device 148 with two independent probes for a Kelvin connection. This is accomplished by placing two contact probes 140 adjacent each other in mirrored fashion so that the contact points of the two probes are adjacent one another and in contact with the pad 146 on the integrated circuit device.

Figure 13:
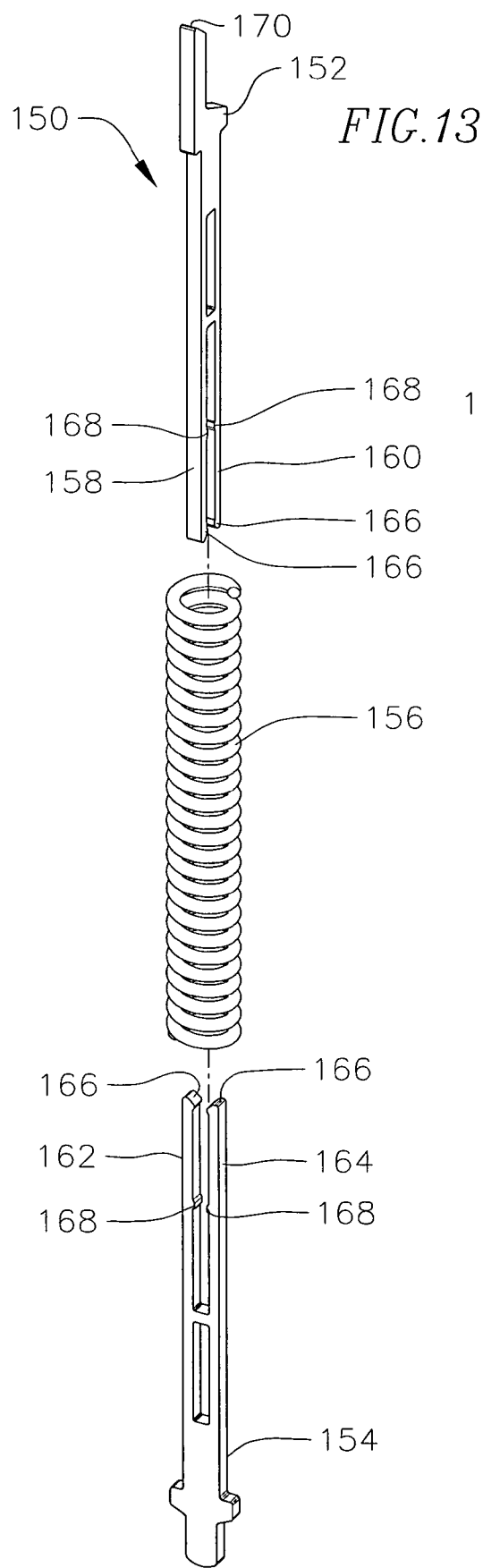
FIG. 13 is a perspective exploded view of a sixth alternative embodiment electrical contact probe.
Figure 14:
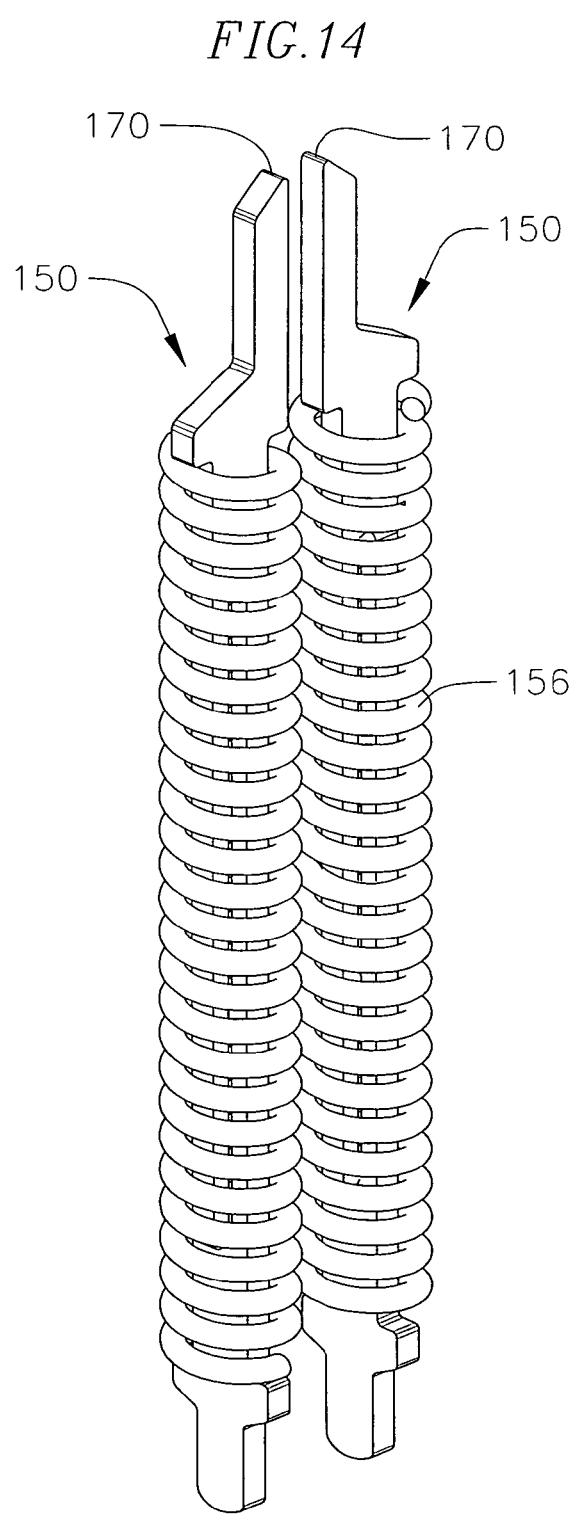
FIG. 14 is a perspective view of the probe of FIG. 13 in a Kelvin configuration.

FIGS. 13 and 14 illustrate another alternative embodiment contact probe 150 for a practical Kelvin configuration. Probe 150 includes an upper component 152 and a lower component 154 and a single compression spring 156. Upper component has two cantilever arms 158 and 160 and lower component 154 has two cantilever arms 162 and 164. Each cantilever arm has an electrical contact bump 166 located at an end of the arm and an interlocking tab 168 located midway down the cantilever arm. Bump 166 is cleanly radiused and is designed to smoothly slide down the flat surface of the opposite component and is the main electrical contact point between the upper and lower components. The upper component 152 and lower component 154 are joined perpendicular to one another such that the cantilever arms and interlocking tabs 168 slideably interlock the upper and lower components together inside of compression spring 156. The upper and lower components captivate the helical spring or non-conductive elastomeric member that provides a spring force that is axial to the overall length of the probe. The upper component 152 has a probe tip 170 similar to probe tip 142 of contact probe 140. As seen best in FIG. 14, the Kelvin configuration places two contact probes adjacent one another in mirrored fashion so that the probe tips 170 can contact the unit under test.

The components and features of the various embodiments are interchangeable for a particular application, and as can be seen from the previous examples a contact probe can be constructed with one or more springs that compress between the upper and lower of two conductive components. The contact probe can also be designed such that the compliance of the assembly is made by the use of one or more helical extension springs. The contact probe of the present invention can also be designed such that the compliance of the assembly is made by the use of one or more compressible conductive elastomers.

The contact probe of the present invention can be constructed with a variety of different tip styles that are optimized to achieve the most stable resistance to an integrated circuit under test. Tip styles include, but are limited to, curved radius, single point sharp tip and dual point sharp tip, and can be positioned either centrally, on the outside portion of the upper or lower component or necked inside.

The contact probe of the present invention can be designed with different latching mechanisms for the upper and lower component. Additional wiping arms can be added to the components to reduce overall path resistance. In addition, one of the components of the contact probe can have a tail such that it can be soldered or press fit into a printed circuit board to reduce overall path resistance. Spring probe tip geometries can be offset, such that adjacent probes could be positioned in such a manner that allow for Kelvin testing of the unit under test. Kelvin testing is often required to test very sensitive parts, or allow circuitry to designed that carry a forcing current through one probe and a sensing voltage drop can be easily measured through an adjacent probe. In order to achieve this in a practical socket design, the probe tips must be located very close to one another and mate with a single unit under test signal pad. In addition, contact geometries and configurations can be designed for optimized matched impedances or other optimized RF signal perimeters.

Although the present invention has been described and illustrated with respect to multiple embodiments thereof, it is to be understood that changes and modifications can be made therein which are within the full intended scope of the invention as hereinafter claimed.

What is claimed is:

1. A compliant electrical interconnect comprising:
   a first component;
   a second component engaged with the first component;
   at least one of the first component or the second component having two biasing cantilever arms for locking engagement with the other component;
   a separate spring member captivated by each of the cantilever arms providing a contact force.

2. The interconnect of claim 1, wherein the cantilever arms have an interlocking tab at the end of each arm.

3. The interconnect of claim 2, wherein the cantilever arms have a tapered surface for flexible engagement by the interlocking tabs.

4. The interconnect of claim 1, wherein both the first component and the second component have two cantilever arms.

5. The interconnect of claim 3, wherein the two cantilever arms of the first component perpendicularly interlock with the two cantilever arms of the second component.

6. The interconnect of claim 1, wherein the first component has a probe tip for contacting a test location.

7. The interconnect of claim 6, wherein the second component has a probe tip for contacting a printed circuit board.

8. The interconnect of claim 1, wherein the biasing means is a compression spring.

9. The interconnect of claim 1, wherein the biasing means is an extension spring.

10. The interconnect of claim 1, further including a second compliant electrical interconnect for forming a Kelvin connection.

11. An electrical contact probe with compliant internal interconnect comprising:
    a plunger having two biasing cantilever arms;
    a barrel having two biasing cantilever arms;
    interlocking tabs located on at least one of the cantilever arms away from an end of the cantilever arms to interlock the plunger and the barrel; and
    two springs captivated by the cantilever arms to provide a contact force for the barrel and the plunger.

12. The probe of claim 11, wherein the cantilever arms have a tapered surface for flexible engagement by the interlocking tabs.

13. The probe of claim 11, wherein the two cantilever arms of the plunger perpendicularly interlock with the two cantilever arms of the barrel.

14. The probe of claim 11, wherein the spring is a compression spring.

15. The probe of claim 11, further comprising an electrical contact bump positioned on an end of each cantilever arm of the plunger and the barrel.

16. An electrical contact probe comprising:
    a plunger having a contact tip;
    a barrel having a contact tip; and
    a latching mechanism comprising two cantilever arms having interlocking tabs located at an end of the two cantilever arms extending from either the plunger or the barrel and a flange having an enlarged head extending from the other of the plunger or the barrel for reciprocating receipt between the cantilever arms; and
    two spring members positioned on either side of the latching mechanism providing a contact force for the barrel and the plunger.

17. The probe of claim 16, wherein there is one spring member positioned around the latching mechanism.

* * * * *